United States Patent
Helm et al.

(10) Patent No.: US 7,100,515 B2
(45) Date of Patent: Sep. 5, 2006

(54) DEVICE FOR POSITIONING A TOOL WITHIN A PREDETERMINED WORKING AREA

(75) Inventors: Manfred Burkhard Helm, Braunschweig (DE); Jurgen Hesselbach, Wolfenbuttel (DE); Lothar Mueller, Heidelberg (DE); Holger Schulz, Bruchsal (DE); Sven Soetebier, Braunschweig (DE); Uwe Waeckerle, Bruchsal (DE)

(73) Assignee: Rohwedder Microtech GmbH & Co. KG, Bruchsal (DE)

( * ) Notice: Subject to any disclaimer, the term of this patent is extended or adjusted under 35 U.S.C. 154(b) by 509 days.

(21) Appl. No.: 10/097,581

(22) Filed: Mar. 15, 2002

(65) Prior Publication Data
US 2003/0051336 A1 Mar. 20, 2003

(30) Foreign Application Priority Data
Mar. 16, 2001 (DE) .......................................... 101 12 808

(51) Int. Cl.
*A47B 85/00* (2006.01)

(52) U.S. Cl. .......................................... 108/20; 108/143
(58) Field of Classification Search ................. 108/161, 108/20, 21, 28, 29, 143; 248/637; 264/55, 264/71; 74/479.01; 414/729
See application file for complete search history.

(56) References Cited
U.S. PATENT DOCUMENTS
4,607,578 A * 8/1986 Inoue et al. ................. 108/145
4,976,582 A * 12/1990 Clavel .......................... 414/729
5,279,178 A * 1/1994 Yanagisawa .............. 74/490.09
5,477,743 A * 12/1995 Yanagisawa .............. 74/490.09
5,582,112 A * 12/1996 Huang .......................... 108/22
5,943,915 A * 8/1999 Kato ........................ 74/490.09
6,276,284 B1 * 8/2001 Remley et al. ................ 108/20

FOREIGN PATENT DOCUMENTS
| DE | 199 42 083 A1 | | 3/2001 |
| EP | 0 916 446 A1 | | 5/1999 |
| GB | 2 308 322 A | | 6/1997 |
| JP | 58-96740 | * | 6/1983 |
| JP | 5983860 | * | 5/1984 |

* cited by examiner

*Primary Examiner*—Jose V. Chen
(74) *Attorney, Agent, or Firm*—Klaus J. Bach

(57) ABSTRACT

In a device for positioning a tool in a working area wherein two spaced parallel horizontal guide tracks are provided and a guide slide is movably supported by each guide track, a coupler link is supported on each guide slide so as to be pivotable about a vertical pivot joint axis and the coupler links are joined to each other pivotably about another joint having an axis parallel to the vertical pivot joints of the coupler links, and a spindle extends from the other joint of the coupler links in alignment with the axis thereof so as to be linearly adjustable and is provided with a tool. The spindle with the tool is position-adjustable by linear movement of the guide slides along the tracks whereby the tool supported by the coupler links which are longer than the distance between the two guide tracks can cover also areas at opposite sides of the two parallel guide tracks.

7 Claims, 4 Drawing Sheets

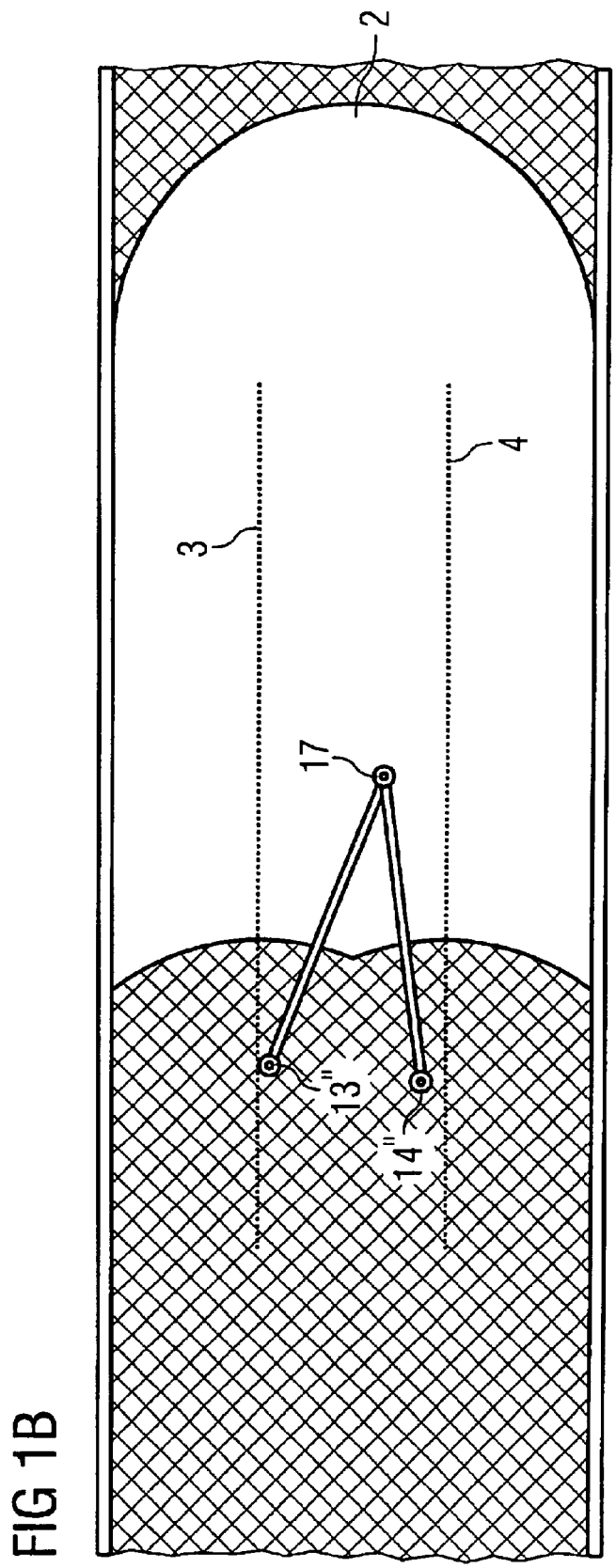

DEVICE FOR POSITIONING A TOOL WITHIN A PREDETERMINED WORKING AREA

This application hereby claims priority under 35 USC section 119 on German patent application number DE 101 12 808.8 filed Mar. 16, 2001, the entire contents of which are hereby incorporated herein by reference.

FIELD OF THE INVENTION

The invention generally relates to a device for positioning a tool within a predetermined working area.

In this case, the term "tool" is to be understood in the most general sense and designates any element which is suitable for performing a function of a mechanical or non-mechanical nature at the predetermined position, e.g. a gripper or a sensor.

BACKGROUND OF THE INVENTION

As a rule, two-dimensional positioning systems are realized as a T- or H-structure. In this case, a portal is moved in an X-direction by a motor or even two motors, and a slide arranged in a movable manner on the portal and carrying the tool is positioned in a Y-direction by a further motor. Relatively large masses are to be moved in the process. The accelerations achievable are comparatively low, so that the working speed of such a system is accordingly also relatively low.

During the automatic fitting of printed circuit boards with components, for example, the tool in the form of a fitting head has to be moved at high speed over the working area. Positioning systems of the aforesaid type can no longer meet the desires for higher production rates.

There is also the fact that, in addition to the two coordinate directions X and Y, a lifting movement of the tool in the direction of a third coordinate direction Z and a rotation about this axis by an angle φ may also be required. For this reason, these two functions have to be integrated via additional subassemblies. This further increases the moving masses and possibly impairs the working area, which in the T- or H-structure is in any case smaller than the construction area.

SUMMARY OF THE INVENTION

An object of an embodiment of the invention is therefore to provide a device for positioning a tool in such a way that it can perform the required functions. In one embodiment, it can preferably perform functions including positioning in a three-dimensional coordinate system, and angular adjustment about an axis without additional subassemblies. Further, it preferably has a small a moving mass, whereas on the other hand the working area is large in relation to the construction area.

In a device for positioning a tool in a working area wherein two spaced parallel horizontal guide tracks are provided and a guide slide is movably supported by each guide track a coupler link is supported on each guide slide so as to be pivotable about a vertical pivot joint axis and the coupler links are joined to each other at the pivotably about another joint having an axis parallel to the vertical pivot joints of the coupler links, and a spindle extends from the other joint of the coupler links in alignment with the axis thereof so as to be linearly adjustable and is provided with a tool. The spindle with the tool is position-adjustable by linear movement of the guide slides along the tracks and with the coupler links being longer than the distance between the two guide tracks also are at opposite sides of the two parallel guide tracks also are at opposite sides of the two parallel guide tracks can be covered by the tool.

Preferably, the coupler links are arranged in a plane spaced from the plane in which the guide tracks with the guide slides are disposed.

Preferably, the coupler links are arranged in a plane spaced from the plane in which the guide tracks with the guide slides are disposed.

Preferably, both coupler links have the same length.

For linearly moving the guide slides along the guide tracks third and fourth drive motors are preferably provided.

The third and fourth drive motors are preferably connected to drive belts which extend along the guide tracks and to which the guide slides are connected.

BRIEF DESCRIPTION OF THE DRAWINGS

The invention is explained below with reference to an exemplary embodiment, shown in the drawings;

FIG. 1b shows a second initial position with the coupler links pivoted in the opposite direction;

DETAILED DESCRIPTION OF THE PREFERRED EMBODIMENTS

Figure 2:
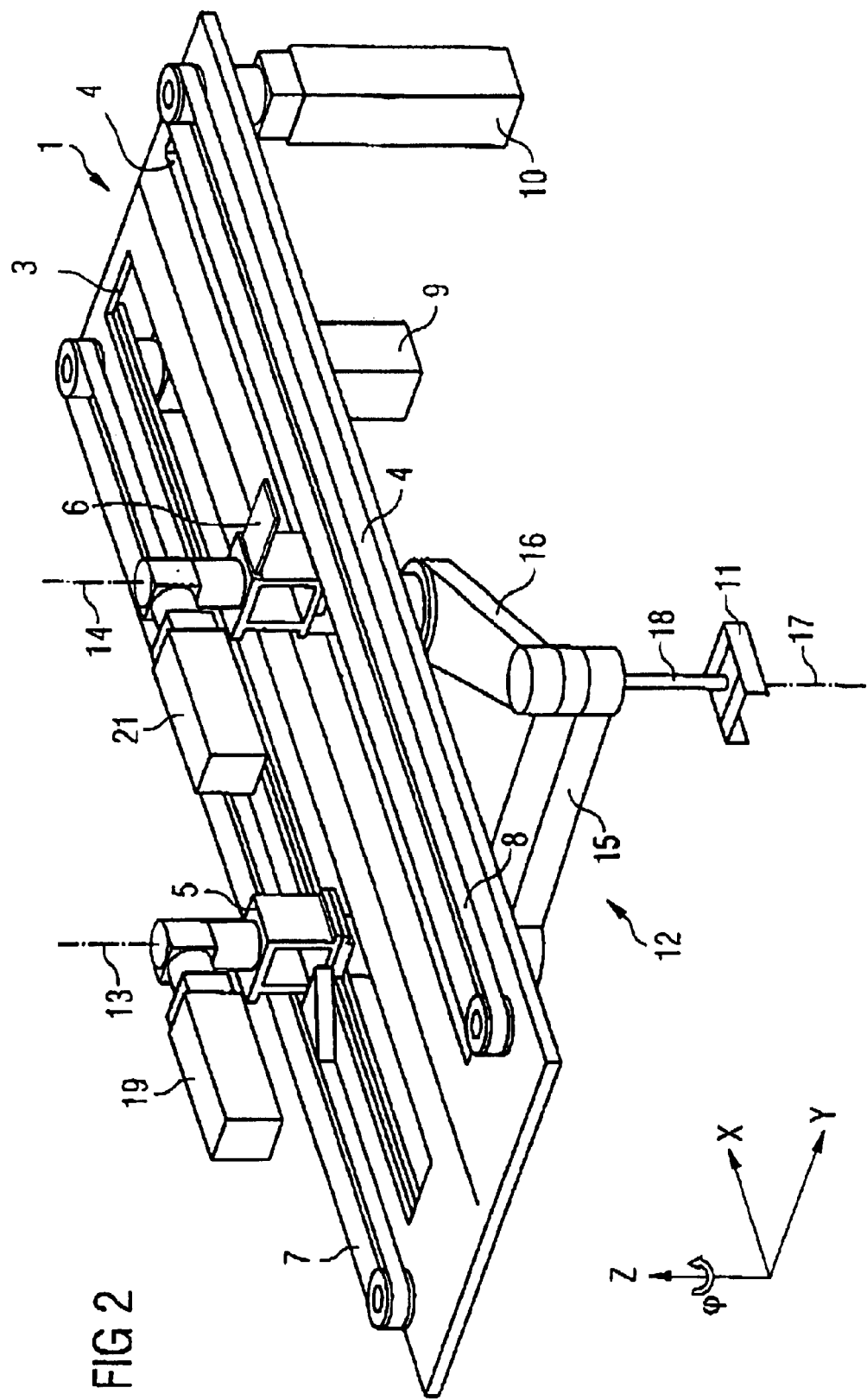
FIG. 2 shows a perspective, partly broken-away view of such a device.

A positioning device 1 has two horizontal guides 3 and 4, which are assigned to a working area 2, are parallel to one another and run in a first coordinate direction X. A guide slide 5 or 6, respectively, (FIG. 2) can be moved along each of these guides 3 and 4. These guide slides 5 and 6 may be adjusted independently of one another in the X-direction, which is effected, for example, via belt drive 7 or 8, respectively, which can be driven via a servomotor 9 or 10, respectively. Both guide slides 5 and 6 are connected to a supporting structure (designated overall by 12) which crosses the working area 2 and carries a symbolically shown tool (designated by 11), e.g. a fitting head for fitting printed circuit boards with components, and is suitable, as a function of the adjustment of the guide slides 5 and 6, for shifting the tool 11 into a position determined by its horizontal X- and Y-coordinates.

The supporting structure 12 is pivotably mounted on the guide slide 5 via a vertical first joint axis 13 running parallel to the Z-coordinate and on the guide slide 6 about a second joint axis 14 parallel thereto. The supporting structure 12 includes two coupler links 15 and 16 which are connected to one another in a movable manner via a third joint axis 17 parallel to the other two joint axes 13 and 14. The length of the coupler links 15 and 16 is the same and is dimensioned in such a way that the third joint axis 17 can be moved over the entire width of the working area 2. Since the plane of movement of the coupler links 15 and 16 is offset in the vertical direction at a distance from the space occupied by the guides 3 and 4, the coupler links can be swung outward beyond the guides 3 and 4 and can thus extend the working area in the Y-direction. This situation is shown in FIG. 1*a* by broken lines, it being assumed that the joint axes 13 and 14 have been shifted into the new positions 13' and 14'.

Figure 1A:
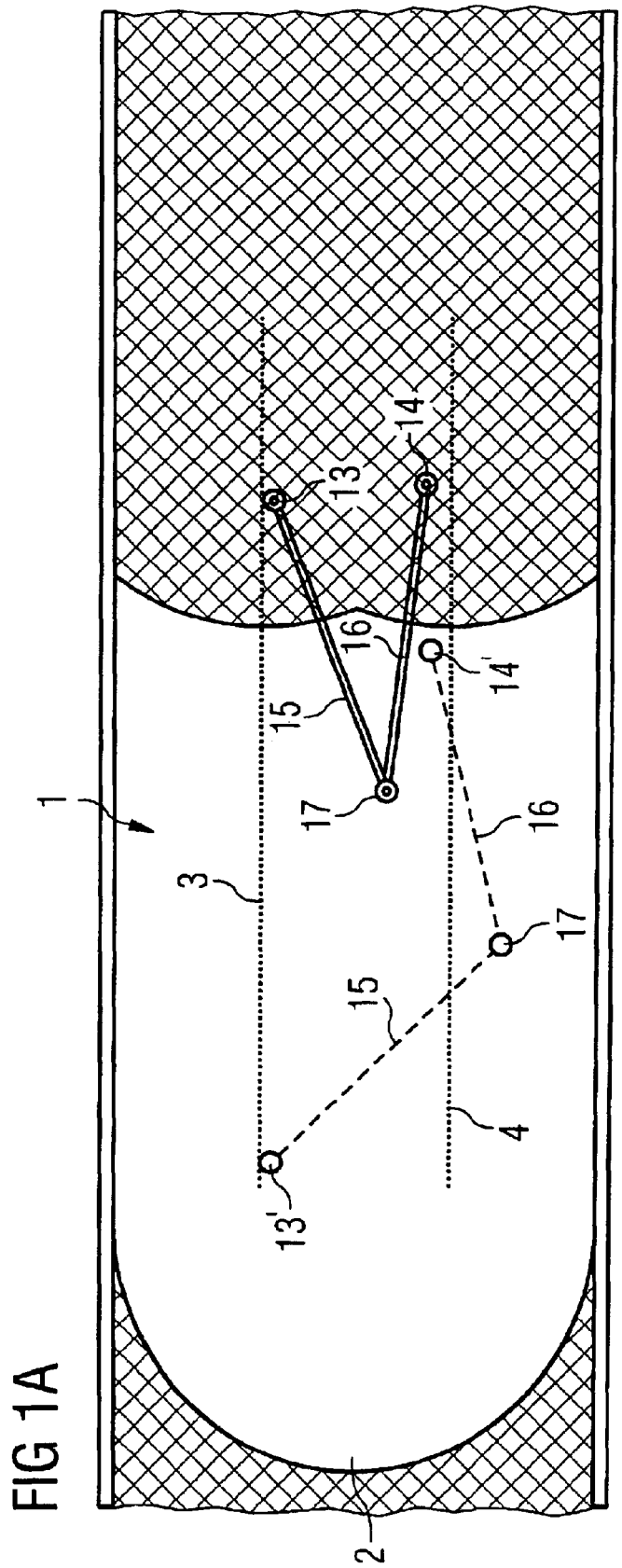
FIG. 1a represents a schematic plan view of a device according to an embodiment of the invention in a first initial position of the coupler links and in an intermediate position.

As shown in FIG. 1*b*, the joint axes 13, 14 can be moved beyond the positions 13', 14' shown in FIG. 1*a*. Thus, the coupler links 15 and 16 are swung through. As a result of this, the working area is also shifted to the right in the X-direction—instead of to the left as shown in FIG. 1*a*—so that a larger working area overall in relation to the construction area of the device is made possible with the device. The changed positions of the joint axes 13 and 14 are designated in FIG. 1*b* by 13" and 14".

From the kinematic point of view, the positioning device 1 according to an embodiment of the invention is a five-bar mechanism with two guide slides 5 and 6 and three rotation axes 13, 14 and 17. The guide slides 5 and 6 are each driven and are mounted so that they can be fixed in a certain position on a guide frame (not shown). The lifting/rotary spindle 18 or a working platform arranged instead of the lifting/rotary spindle 18 is fastened to one of the two coupler links 15 or 16. In terms of control, it is simplest to design the working platform or the lifting/rotary spindle 18 in such a way that the gripper is arranged exactly on the rotation axis 17 between the coupler links 15 and 16.

Figure 3:
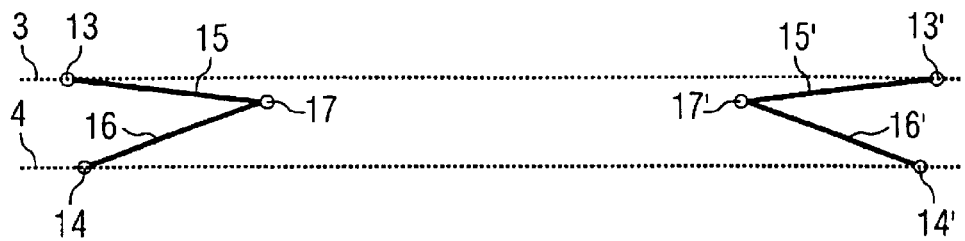
FIG. 3 shows schematically two different working configurations of the device according to the invention.
Figure 4A:
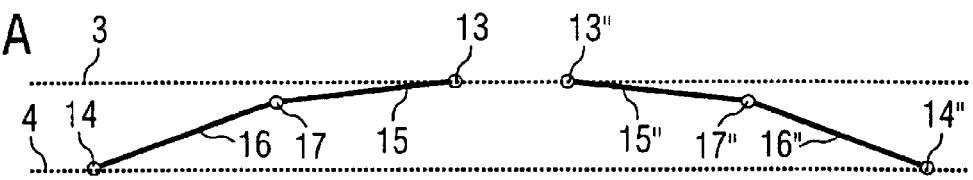
FIGS. 4a and 4b show schematic views of in each case two transition configurations of the device according to an embodiment of the invention.
Figure 4B:
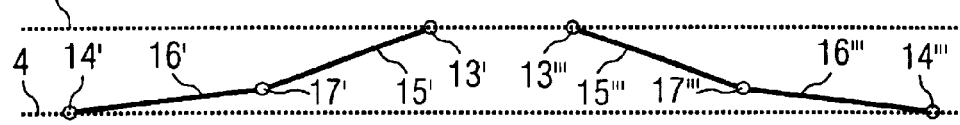

Mathematical equations may be used in order to control the positioning device 1 according to an embodiment of the invention. In this case, an inverse kinematic problem (IKP) which contains two root terms occurs on the one hand. Furthermore, a direct kinematic problem (DKP) occurs which contains one root term in the mathematical equation. This results in four solutions for the IKP and two solutions for the DKP of the respective mathematical equations. Since in each case two solutions of the IKP clearly correlate with one of the solutions of the DKP, such as, for example, the two arrangements shown schematically in FIG. 3 of the individual elements 13 to 17 of the positioning device I according to an embodiment of the invention and of their working spaces, and only the remaining two solutions of the IKP have to be split into partial solutions with different DKP solutions, as shown in FIGS. 4*a* and 4*b* as transition configurations of the positioning device 1 according to an embodiment of the invention, six possible configurations for the structure of the positioning device 1 according to an embodiment of the invention are finally obtained. The changed positions of the joint axes 13, 14 and 17 in the respective working or transition configurations are designated in FIGS. 3 to 6 by 13, 14, 17; 13', 14' 17'; 13", 14", 17", and 13''', 14''', 17''', respectively.

Figure 5A:
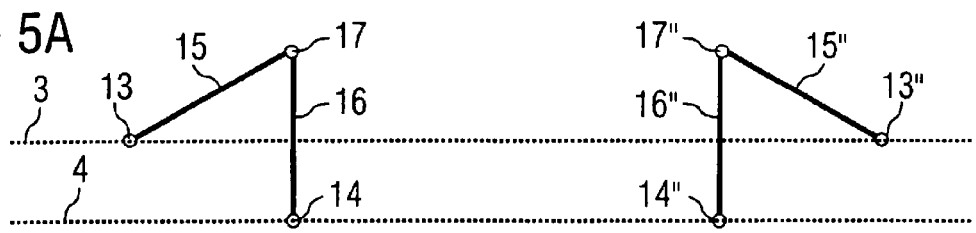
FIGS. 5a and 5b show schematic views of the device according to an embodiment of the invention with the joint axis disposed in different positions outside the guide tracks.
Figure 5B:
Figure 6:
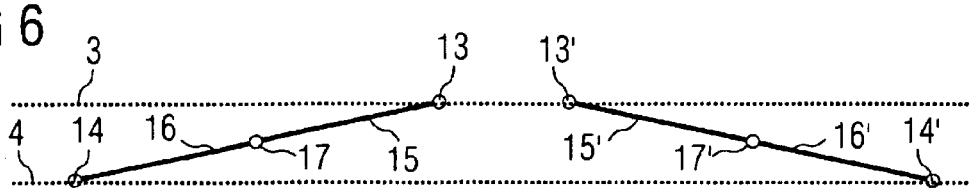
FIG. 6 shows a schematic view of the device according to the invention with the joint axis disposed centrally between the support points on the guide tracks.

A distinction must therefore be made between the transitions from one solution of the IKP to a second solution of the IKP (IKP change); that is to say the change from a working configuration to a transition configuration, of which four are possible, as can be seen from FIG. 5. On the other hand, there are transitions between two transition configurations, i.e. the change from one solution of the DKP to another solution of the DKP (DKP change), of which two are possible, as can be seen from FIG. 6.

An IKP change leads through a singularity of the first type, i.e. through a structure position of the positioning device 1 according to an embodiment of the invention in which a drive can be moved without the working platform or the rotary/lifting spindle 18 moving. Since the structure of the positioning device 1 during an IKP change remains IKP change remains kinematically defined at any instant, it is merely necessary, for the control of the drives of the positioning device 1, to use changed mathematical equations, i.e. for example, equations with different signs, for the solution of the IKP and to control only the drives 9 and 10 in a region around the singularity of the first type without calculating the IKP.

In contrast, a DKP change leads through a singularity of the second type, i.e. through a structure position of the positioning device 1 in which the working platform or the rotary/lifting spindle 18 can be moved without a drive, i.e. one of the servomotors 9 or 10, causing a movement. In this position, the positioning device 1 is kinematically underdefined and both control measures and design measures have to be taken in order to be able to pass through these kinematically underdefined points in a reliable manner and with a clearly defined movement.

It is also possible to pass through a DKP change dynamically without design measures at the positioning device 1. In this case, however, reliable operation is not always ensured. In order to also ensure a reliable operation in this respect, at least one sensor (not shown) must be provided, it being possible for the signal for the signal from this sensor to be evaluated by a control device and for the current configuration of the positioning device 1 to be determined from this signal.

At least four approaches are possible for a design solution to the DKP change.

Firstly, an additional drive may be provided on one of the—hitherto passive—joint axes 13, 14, and 17, this drive being moved along at no-load during normal operation. In the region of a DKP change, i.e. when passing through a singularity of the second type, one of the drives 9 or 10 of a guide slide 5 or 6, respectively, is switched to no-load and the additional drive (not shown) moves the positioning device 1 through the singularity of the second type. For this small and slow movement, the additional drive may be of appropriately small dimensions, which reduces the additional masses.

On the other hand, each mechanism can be extended by double hinges without influencing the movements of the remaining links. An extension by a double hinge makes a seven-bar mechanism from a five-bar mechanism. However, if one of the additional joints is locked, for example, via a brake, a six-bar mechanism is obtained, the defined movement of which only requires a single drive. An actual design of a double hinge is, for example, a revolving belt. If the latter or one of two deflection pulleys which direct the revolving belt is braked, the positioning device can be moved through the DKP change by the use of only a single drive.

Furthermore, it is possible, by introducing a force, to impose a preferred direction on the positioning device 1 when passing through a singularity of the second type. In this case, this force may be introduced not only actively but also passively, for example, via a torsion spring in one of the joint axes 13, 14, or 17 near the drive or also via a tension spring between one of the guide slides 5 or 6 and the associated coupler link 15 or 16, respectively. The DKP change can be initiated in this case by switching off one of the drives 9 or 10. In this case, however, the time required for the DKP change cannot be clearly determined or predicted. In particular, the transition through a DKP change is also possible only in one direction on account of the directional spring effect. Thus the transitions between the working configurations are also only possible in one direction.

A further more flexible way of passing through a DKP change in a clearly defined manner is to pass dynamically through the singularity of the second type. So that the working platform or rotary/lifting spindle 18 can run out of a movement from one transition configuration into a second transition configuration, one of the two drives 9 or 10 must be kept massless on account of the law of the angular momentum, that is to say that the positioning device 1 has a sensor device which can determine the force which is applied to at least one of the joint axes 13 or 14 near the drive. By evaluation of the signal of the sensor device, this force is regulated to zero in one of the two joint axes 13 or 14 for the region around the DKP change. In this way, it is possible to pass through the singularity of the second type in a clearly defined manner without using an additional drive. Furthermore, this may also be carried out independently of direction.

So that the position of the tool 11 can also be set in a third coordinate direction Z and in its angular position φ relative to this Z-axis, a lifting/rotary spindle 18 is arranged coaxially to the third joint axis 17, to be precise in such a way that a collision with the guides 3 and 4 is impossible.

The movement in the Z-direction can be produced in the lifting/rotary spindle 18 by a design as a ball screw, known per se, mechanical drive being effected by a servomotor 19 which is carried by the guide slide 5 and whose actuating movement is effected via a transmission connection, e.g. a belt drive, which is completely encapsulated in the coupler link 15 and therefore cannot be seen. However, the vertically movable spindle and the element guiding the spindle may also be designed as elements of a linear motor, as a result of which the servomotor 19 and the transmission connection assigned to it may be dispensed with and only a supply and control line for the linear motor has to be run through the coupler link 15.

A servomotor 21 on the guide slide 6 serves to move the lifting/rotary spindle 18 about a rotation angle φ this servomotor 21 being connected via a transmission connection, likewise a belt drive for example, to the lifting/rotary spindle 18. This transmission connection is encapsulated in the coupler link 16. It is configured in such a way that it transmits an actuating movement of the servomotor 21 to the lifting/rotary spindle 18 in the correct angular relationship. This ensures that, during an adjustment of the tool position in the three-dimensional coordinate system X, Y, Z, the tool 11 is always shifted parallel to itself provided an additional angular adjustment is not carried out by the servomotor 21.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A device for positioning a tool (1) in a working area, said device having two spaced parallel horizontal guide tracks (3, 4), two guide slides (5, 6) movably supported one in each of the guide tracks 3, 4, two coupler link (15, 16) pivotally supported at one end thereof each on one of the guide slides (5, 6) so as to be pivotable about first and second vertical joint axes, and being joined to each other by a third joint formed at the other ends of the coupler links (15, 16) pivotally about the third joint axis which extends parallel to the first and second vertical joint axes, a spindle extending from the joint of the coupler links in alignment with the third joint axis (17) so as to be linearly adjustable, and a tool or tool holder (11) mounted on the spindle (18), the coupler links (15, 16) being longer than the distance between the two guide tracks (3, 4) so that also areas at opposite sides of the guide tracks (3, 4) can be swept over by third joint and the spindle with the tool or tool holder (11) connected thereto.

2. The device as claimed in claim 1, wherein the coupler links (15, 16) are arranged in a plane spaced from the plane in which the guide tracks (3, 4) are disposed.

3. The device as claimed in claim 1, wherein a first drive motor (19) is disposed on one (5) of the guide slides (5, 6) and operatively connected to the spindle (18) by way of drive means extending through the coupler link 15 mounted to the one guide slide (5) for raising and lowering the spindle 18.

4. The device as claimed in claim 3, wherein a second drive motor (21) is disposed on the other (6) of the guide slides (5, 6) and is operatively connected to the spindle (18) by way of drive means extending through the other coupler link (16) connected to the other guide slide (5) for rotating the spindle (18).

5. The device as claimed in claim 1, wherein both coupler links (15, 16) have the same length.

6. The device as claimed in claim 1, wherein third and fourth drive motors (9, 10) are provided for linearly moving the guide slides (5 and 6), respectively.

7. The device as claimed in claim 6, wherein belt drives (7 and 8) extend along the guide track (3, 4) and are connected to the guide slides (3, 6) and operated by the third and fourth drive motors respectively for moving the guide slides (5, 6).

* * * * *